(12) United States Patent
Boeck et al.

(10) Patent No.: US 11,879,966 B2
(45) Date of Patent: Jan. 23, 2024

(54) TRANSMISSION OF WIRELESS SIGNAL HAVING INFORMATION ON A LOCAL OSCILLATOR SIGNAL

(71) Applicant: Infineon Technologies AG, Neubiberg (DE)

(72) Inventors: Josef Boeck, Putzbrunn (DE); Rudolf Lachner, Ingolstadt (DE); Maciej Wojnowski, Munich (DE); Walter Hartner, Bad Abbach-Peissing (DE)

(73) Assignee: Infineon Technologies AG, Neubiberg (DE)

( * ) Notice: Subject to any disclaimer, the term of this patent is extended or adjusted under 35 U.S.C. 154(b) by 235 days.

(21) Appl. No.: 17/248,003

(22) Filed: Jan. 5, 2021

(65) Prior Publication Data
US 2021/0247510 A1 Aug. 12, 2021

Related U.S. Application Data

(63) Continuation of application No. 15/901,108, filed on Feb. 21, 2018, now abandoned, which is a
(Continued)

(51) Int. Cl.
*G01S 13/86* (2006.01)
*G01S 13/00* (2006.01)
(Continued)

(52) U.S. Cl.
CPC ............ *G01S 13/86* (2013.01); *G01S 7/006* (2013.01); *G01S 7/02* (2013.01); *G01S 13/003* (2013.01);
(Continued)

(58) Field of Classification Search
CPC .......... G01S 7/02; G01S 13/003; G01S 7/032; G01S 13/878; G01S 13/931; G01S 13/86; G01S 7/006; H04B 1/40; H01L 2223/6677
See application file for complete search history.

(56) References Cited

U.S. PATENT DOCUMENTS

| 5,955,752 A | 9/1999 | Fukaya et al. |
|---|---|---|
| 6,043,785 A | 3/2000 | Marino |

(Continued)

FOREIGN PATENT DOCUMENTS

| CN | 101496298 A | 7/2009 |
|---|---|---|
| CN | 102508199 A | 6/2012 |

(Continued)

OTHER PUBLICATIONS

S. Foulon, S. Pruvost, C. Loyez, N. Rolland and V. Avramovic, "A 10GBits/s 2.1pJ/bit OOK demodulator at 60GHz for chip-to-chip wireless communication," 2012 IEEE Radio and Wireless Symposium, 2012, pp. 291-294, doi: 10.1109/RWS.2012.6175320. (Year: 2012).*

(Continued)

*Primary Examiner* — Marcus E Windrich
(74) *Attorney, Agent, or Firm* — Harrity & Harrity, LLP

(57) ABSTRACT

A semiconductor package having an antenna; and a semiconductor die which is coupled to the antenna and comprises a transmitter configured to transmit wirelessly via the antenna a wireless signal having information on a local oscillator signal to a further semiconductor package comprising a further semiconductor die.

25 Claims, 6 Drawing Sheets

Related U.S. Application Data continuation of application No. 14/135,069, filed on Dec. 19, 2013, now Pat. No. 9,910,145.

(51) Int. Cl.

| | |
|---|---|
| *G01S 7/00* | (2006.01) |
| *G01S 7/02* | (2006.01) |
| *H04B 1/40* | (2015.01) |
| G01S 13/931 | (2020.01) |
| G01S 7/03 | (2006.01) |
| G01S 13/87 | (2006.01) |

(52) U.S. Cl.
CPC ............... *H04B 1/40* (2013.01); *G01S 7/032* (2013.01); *G01S 13/878* (2013.01); *G01S 13/931* (2013.01); *H01Q 2223/6677* (2013.01); *H01L 2224/04105* (2013.01); *H01L 2224/12105* (2013.01)

(56) References Cited

U.S. PATENT DOCUMENTS

| | | | |
|---|---|---|---|
| 6,236,366 | B1 | 5/2001 | Yamamoto et al. |
| 8,451,618 | B2 | 5/2013 | Boeck et al. |
| 9,910,145 | B2 | 3/2018 | Boeck et al. |
| 2003/0021137 | A1 | 1/2003 | Johnson et al. |
| 2006/0001116 | A1 | 1/2006 | Auburger et al. |
| 2006/0132350 | A1* | 6/2006 | Boltovets ............... G01S 7/032 342/72 |
| 2006/0276157 | A1 | 12/2006 | Chen et al. |
| 2007/0026567 | A1 | 2/2007 | Beer et al. |
| 2009/0102724 | A1 | 4/2009 | Tsutsumi |
| 2010/0193935 | A1* | 8/2010 | Lachner ............... H01Q 9/0457 257/693 |
| 2012/0013499 | A1 | 1/2012 | Hayata |
| 2012/0018897 | A1 | 1/2012 | Park et al. |
| 2012/0104574 | A1 | 5/2012 | Boeck et al. |
| 2012/0293358 | A1 | 11/2012 | Itoh |
| 2013/0077222 | A1 | 3/2013 | Sleven |
| 2014/0044157 | A1* | 2/2014 | Chang ............... G06F 15/7842 375/257 |
| 2014/0141713 | A1* | 5/2014 | Shirinfar ............... H01Q 3/00 455/25 |
| 2018/0180730 | A1 | 6/2018 | Boeck et al. |

FOREIGN PATENT DOCUMENTS

| | | |
|---|---|---|
| DE | 10348621 A1 | 6/2005 |
| DE | 102011085348 A1 | 5/2012 |
| EP | 0884799 A2 | 12/1998 |

OTHER PUBLICATIONS

Celebi H., et al., "Ultraband Design Challenges for Wireless Chip-to-Chip Communications and Interconnects," IEEE, 2006, 8 pages.
Fettweis G.P., et al., "Wireless Interconnect for Board and Chip Level", IEEE Conference Design Automation and Test, 2013, pp. 958-963.
Foulon S., et al., "A 10 GBits/s 2.1 pJ/bit OOK demodulator at 60GHz for chip-to-chip wireless communication," 2012, IEEE Radio and Wireless Symposium, pp. 291-294.
Foulon S., et al., "A 142GHz fully integrated wireless chip to chip communication system for high data rate operation," European Solid-State Circuits Conference (ESSCIRC), Sep. 2013, pp. 77-80.
Hasch J., et al., "Millimeter-Wave Technology for Automotive Radar Sensors in the 77 Ghz Frequency Band," IEEE Transactions on Microwave Theory and Techniques, Mar. 2012, vol. 60 (3), pp. 845-860.
Park J.D., et al., "A 260 GHz fully integrated CMOS transceiver for wireless chip-to-chip communication," 2012 Symposium on VLSI Circuits (VLSIC), pp. 48-49.
Zhang M., et al. "Radar Systems", Nationally Planned textbook for "Eleventh Five Year Plan" for General Higher Education, Nov. 2011.

\* cited by examiner

TRANSMISSION OF WIRELESS SIGNAL HAVING INFORMATION ON A LOCAL OSCILLATOR SIGNAL

RELATED APPLICATIONS

This application is a continuation of U.S. patent application Ser. No. 15/901,108, filed Feb. 21, 2018, which is a continuation of U.S. patent application Ser. No. 14/135,069, filed Dec. 19, 2013 (now U.S. Pat. No. 9,910,145), which are incorporated herein by reference.

TECHNICAL FIELD

Embodiments relate to wireless chip-to-chip communication and in particular to a wireless communication system, a radar system and a method for determining a position information of an object.

BACKGROUND

In many circuit systems, signals have to be transmitted from one device to another. Such signals may be transmitted through wired connections or wirelessly. Especially high frequency signals are difficult to transmit through wired connections due to high losses and strong restrictions regarding connection length and routing. It may be desired to provide a chip-to-chip communication with low effort and/or high flexibility.

SUMMARY

Some embodiments relate to a wireless communication system comprising a first semiconductor module and a second semiconductor module. The first semiconductor module comprises a semiconductor die connected to an antenna structure. The semiconductor die of the first semiconductor module and the antenna structure of the first semiconductor module are arranged within a common package. The semiconductor die of the first semiconductor module comprises a transmitter module configured to transmit the wireless communication signal through the antenna structure of the first semiconductor module. The second semiconductor module comprises a semiconductor die connected to an antenna structure. The semiconductor die of the second semiconductor module comprises a receiver module configured to receive the wireless communication signal through the antenna structure of the second semiconductor module from the first semiconductor module.

Some embodiments relate to a radar system with a proposed wireless communication system.

Some embodiments relate to a method for determining a position information of an object. The method comprises transmitting a radar signal to at least one object by a transmitter device and receiving a reflected radar signal caused by a reflection of the radar signal at the least one object by a receiver device. Further, the method comprises wirelessly-transmitting a wireless communication signal containing information on a phase of a local oscillator signal used for generating the radar signal by the transmitter device and receiving the wireless communication signal by the receiver device. Additionally, the method comprises determining a position information of the at least one object based on the received reflected radar signal and the information on the phase of the local oscillator signal contained by the received wireless communication signal.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, acts, operations, elements and/or components, but do not preclude the presence or addition of one or more other features, integers, acts, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1A:
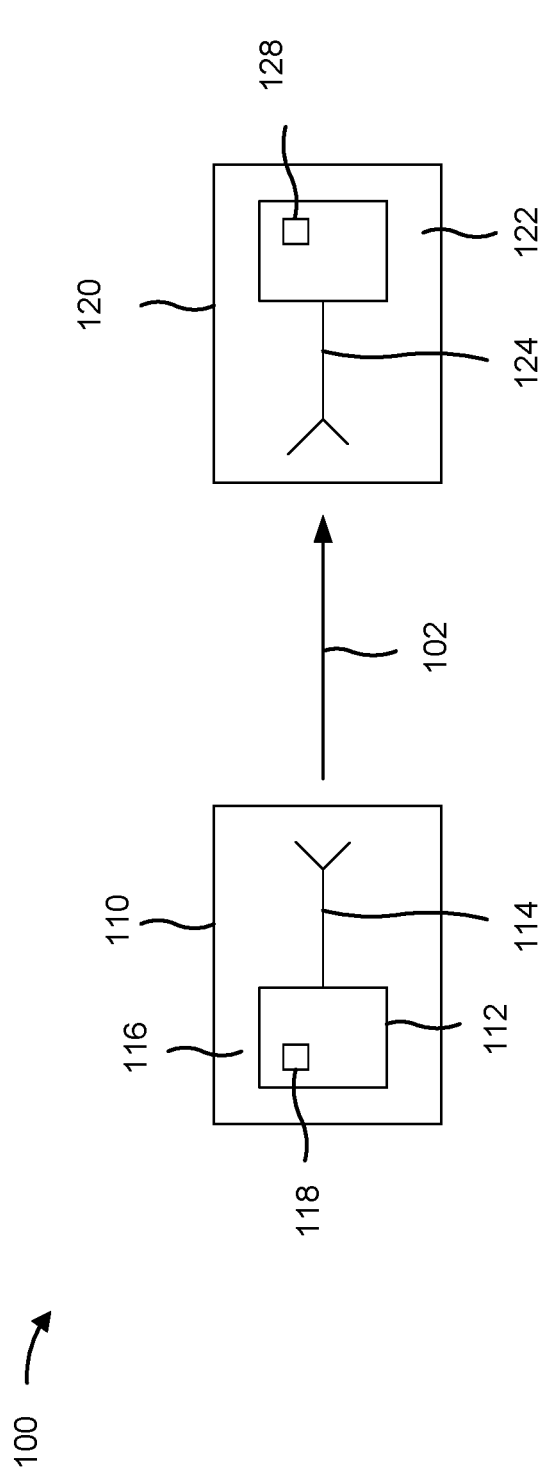
FIG. 1a shows a schematic top view of a wireless communication system.
Figure 1B:
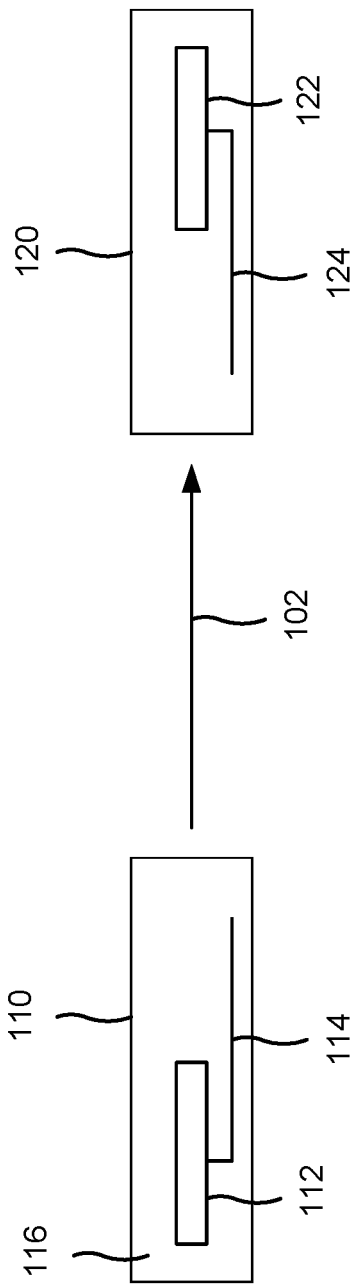
FIG. 1b shows a schematic cross-section through the semiconductor modules of the wireless communication system.

FIGS. 1a and 1b show a schematic illustration of a wireless communication system 100 according to an example. The wireless communication system comprises a first semiconductor module 110 and a second semiconductor module 120. The first semiconductor module 110 comprises a semiconductor die 112 connected to an antenna structure 114. The semiconductor die 112 of the first semiconductor module 110 and the antenna structure 114 of the first semiconductor module 110 are arranged within a common package 116. The semiconductor die 112 of the first semiconductor module 110 comprises a transmitter module (transmitter circuit) configured to transmit a wireless communication signal 102 through the antenna structure 114 of the first semiconductor module 110. Further, the second semiconductor module 120 comprises a semiconductor die 122 connected to an antenna structure 124. The semiconductor die 122 of the second semiconductor module 120 comprises a receiver module (receiver circuit) configured to receive the wireless communication signal through the antenna structure 124 of the second semiconductor module 120 from the first semiconductor module 110.

By implementing a wireless chip-to-chip communication, a very flexible signal transmission between different modules may be implemented. Further, by integrating the antenna structure into a common package with the semiconductor die comprising the transmitter structure at least the transmitter for the wireless signal transmission may be implemented with low hardware effort and/or low space consumption.

The two semiconductor modules may be arranged independent from each other on a common circuit board (e.g. printed circuit board PCB) or may be arranged on different circuit boards due to the flexibility of the wireless connection.

The first semiconductor module 110 may comprise more than one semiconductor die within the common package 116 comprising circuitry with different functionality, for example. Further, the semiconductor die 112 of the first semiconductor module 110 may comprise optional additional circuitry modules in addition to the transmitter module.

The semiconductor die 112 and the antenna structure 114 are arranged within a common package. The common package may be implemented in various ways. For example, the antenna structure of the first semiconductor module 110 may be embedded within the molding material of the common package 116 used for encapsulating the semiconductor die 112 of the first semiconductor module 110. In other words, the antenna structure 114 may be surrounded by molding material of the common package 116. For example, the antenna structure 114 may be electrically connected only to one or more semiconductor dies within the common package 116 of the first semiconductor module 110 without an (direct) electrical connection to an element outside the common package 116.

For example, the common package 116 of the first semiconductor module 110 may be a wafer level package. Optionally, the antenna structure 114 of the first semiconductor module 110 may be implemented within at least one redistribution layer (e.g. metal layer within a passivation structure of the semiconductor die) of the wafer level package.

The semiconductor die 122 of the second semiconductor module 120 and the antenna structure 124 of the second semiconductor module 120 may be also arranged within a common package as indicated in FIGS. 1a and 1b. In this way, also the hardware effort and/or the space consumption of the second semiconductor module 120 may be kept low. Alternatively, the antenna structure 124 of the second semiconductor module 120 may be arranged or connected to a circuit board connectable or connected to the second semiconductor module 120.

A wireless communication system may be a system comprising at least one wireless transmitter and one wireless receiver in communication with each other. However, the wireless communication system may comprise more optional transmitting and/or receiving components. Each transmitting and/or receiving component may also be implemented as a transceiver device for a bidirectional communication, for example.

Similarly to the first semiconductor module 110, the second semiconductor module 120 may comprise one or more semiconductor die(s) implementing different functionalities, for example.

The semiconductor die 112 of the first semiconductor module 110 and/or the semiconductor die 122 of the second semiconductor module 120 may be implemented by any semiconductor processing technology capable of forming the mentioned semiconductor devices, for example. In other words, the first semiconductor die 112 of the first semiconductor module 110 and/or the second semiconductor die 122 of the second semiconductor module 120 may comprise a silicon-based semiconductor substrate, a silicon carbide-based semiconductor substrate, a gallium arsenide-based semiconductor substrate or a gallium nitride-based semiconductor substrate, for example.

The antenna structure 114 of the first semiconductor module 110 and/or the antenna structure 124 of the second semiconductor module 120 may comprise a geometry and/or element suitable for transmitting signals with a desired transmit frequency (transmit frequency of the wireless communication signal).

A maximal dimension of the antenna structure of the first semiconductor module 110 and/or the antenna structure 124 of the second semiconductor module 120 may depend on the frequency of the wireless communication signal 102 to be transmitted through the antenna structures or to be received through the antenna structures. For high frequency signals, signals may be already transmitted with very small antennas. For example, the antenna structure 114 of the first semiconductor module 110 and/or the antenna structure 124 of the second semiconductor module 120 may comprise a maximal dimension (e.g. largest extension in one direction) smaller than 1 cm (or smaller than 5 mm or smaller than 3 mm, for example, about 2 mm for frequencies above 70 GHz).

Optionally, the antenna structure 114 of the first semiconductor module 110 and/or the antenna structure 124 of the second semiconductor module 120 may comprise a maximal dimension larger than a maximal dimension (extension in one direction) of the semiconductor die 112 of the first semiconductor module 110 and/or the semiconductor die 122 of the second semiconductor module 120. In other words, the common package 116 of the first semiconductor module 110 may be significantly larger than the semiconductor die 112 of the first semiconductor module 110, since the antenna structure 114 of the first semiconductor module 110 may require a larger area than the semiconductor die 112 of the first semiconductor module 110 (e.g. by using a fan out package technology).

The wireless communication signal may contain arbitrary information to be transmitted from the first semiconductor module 110 to the second semiconductor module 120. For example, the wireless communication signal may contain information or data to be transmitted to the second semiconductor module 120 only by the amplitude of the wireless communication signal 102 (e.g. load modulation), only by the phase of the wireless communication signal 102 (e.g. phase modulation) or by the amplitude and the phase of the wireless communication signal (e.g. quadrature amplitude modulation). For example, the wireless communication signal may contain information on a phase of a local oscillator signal of the first semiconductor module 110 or arbitrary data may be transmitted by modulating amplitude and phase of the wireless communication signal 102.

The second semiconductor module 120 may use information contained by the received wireless communication signal 102 for providing a desired functionality of the wireless communication system (e.g. determining a position information of an object or providing information contained by the wireless communication system for further processing).

The first semiconductor module 110 and the second semiconductor module 120 may be arrangeable with an arbitrary distance and in an arbitrary direction to each other due to the wireless communication. For example, the first semiconductor module 110 and the second semiconductor module 120 may be arranged with a distance of more than 10 cm (or more than 5 cm, more than 20 cm, more than 50 cm, more than 1 m or more than 2 m). Further, the first semiconductor module 110 and the second semiconductor module 120 may be arranged with a distance of less than 5 m (or less than 10 m, less than 2 m or less than 1 m) so that a direct wireless signal path between the first semiconductor module 110 and the second semiconductor module 120 may be achievable, for example. In other words, the first semiconductor module 110 and the second semiconductor module 120 may be obtained so that the wireless communication signal 102 may reach the second semiconductor module 120 through a direct wireless signal path (e.g. however, further signal portions with longer signal path to due reflections or scattering may be possible).

The distance between the first semiconductor module 110 and the second semiconductor module 120 may be constant during the transmission of the wireless communication signal (e.g. implementing a receiver and a transmitter of a radar system of a vehicle). In other words, the wireless communication system 100 may be a wireless chip-to-chip communication system with semiconductor modules (chips) comprising a constant distance to each other.

Optionally, additionally or alternatively to one or more aspects mentioned above, the first semiconductor module 110 and the second semiconductor module 120 may exchange signals solely wireless. In other words, a wired connection for transmitting signals between the semiconductor modules of the wireless communication system may be unnecessary due to the wireless communication. Alternatively, an additional wired connection may be implemented between the first semiconductor module 110 and the second semiconductor module 120 (e.g. for transmitting low frequency signals, while high frequency signals are transmitted through the wireless interface).

The wireless interface of the wireless communication system 100 may be used for signals with very high frequencies, since small antennas may be sufficient for such signals and/or a wired transmission of such signals may require large hardware efforts and may be restricted in many ways. For example, the transmitter module of the semiconductor die 112 of the first semiconductor module 110 may transmit the wireless communication signal with a frequency higher than 10 GHz (or higher than 20 GHz, higher than 50 GHz or higher than 70 GHz).

The first semiconductor module 110 may transmit the wireless communication signal 102 to more than one other semiconductor module comprising a receiver module. In other words, the wireless communication system 100 may comprise a third semiconductor module comprising a semiconductor die connected to an antenna structure and the semiconductor die of the third semiconductor module comprises a receiver module configured to receive the wireless communication signal 102 through the antenna structure of the third semiconductor module from the first semiconductor module 110.

Different receiving modules may be arranged with different distances to the first semiconductor module 110. In other words, the second semiconductor module 120 and the third semiconductor module may be arranged with different distances to the first semiconductor module 110. The difference of the distances to the first semiconductor module 110 may be larger than 1 cm, or larger than 10 cm, larger than 50 cm or larger than 1 m).

The geometry of the antenna structure may enable the implementation of a main transmit direction. For the chip-to-chip communication, a main transmit direction may be implemented in parallel to the packages of the semiconductor modules, if the semiconductor modules are arranged mainly laterally distributed to each other. Alternatively, the main transmit and/or receive direction may be implemented orthogonally to the semiconductor modules, if the semiconductor modules are arranged mainly above each other, for example. In other words, the antenna structure of the first semiconductor module 110 may provide the wireless communication signal 102 in a direction in parallel to a main surface (e.g. the surface with the majority of circuitry) of the semiconductor die 112 of the first semiconductor module 110 with a signal strength larger than a signal strength of the wireless communication signal 102 in a direction orthogonal to the main surface of the semiconductor die of the first semiconductor module 110 or vice-versa.

Figure 2:
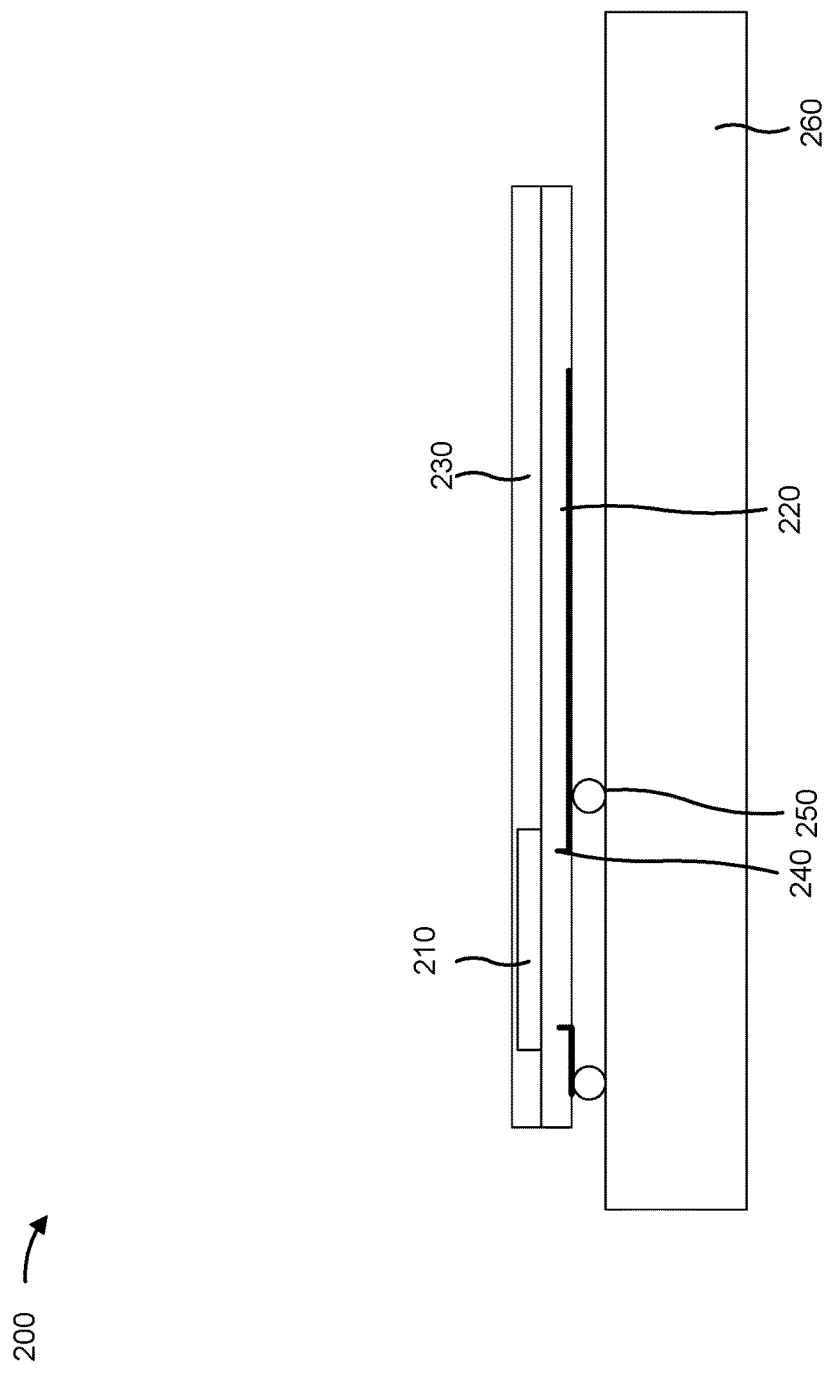
FIG. 2 shows a schematic cross-section of a semiconductor module.
Figure 3:
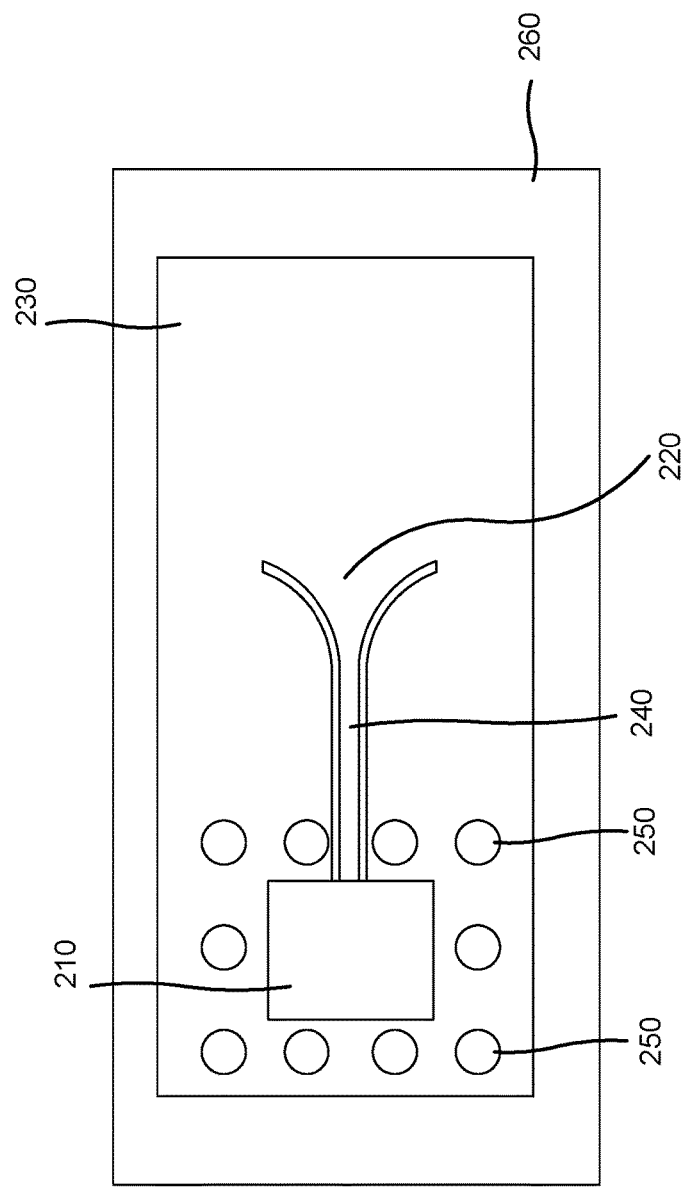
FIG. 3 shows a schematic top view of another semiconductor module.

FIG. 2 shows a schematic cross-section of an integrated circuit 200 (semiconductor module) with integrated antenna 220 and a corresponding top view as shown in FIG. 3. The semiconductor die 210 (e.g. silicon Si chip in package) and the antenna 220 are arranged in a common package 230. The antenna 220 is implemented within the redistribution layer 240 of the package. The semiconductor module 200 is mounted to a printed circuit board 260 through solder balls 250. In other words, FIG. 4 shows a schematic cross-section of a circuitry 200 with an antenna 220 integrated into the package 230 for a chip-to-chip communication and FIG. 3 shows a top view of the circuitry 200 and the antenna 220 integrated into the package 230 with a radiation characteristic of the antenna 220 in parallel to the package 230 or the printed circuit board PCB surface (e.g. Vivaldi antenna).

Figure 4:
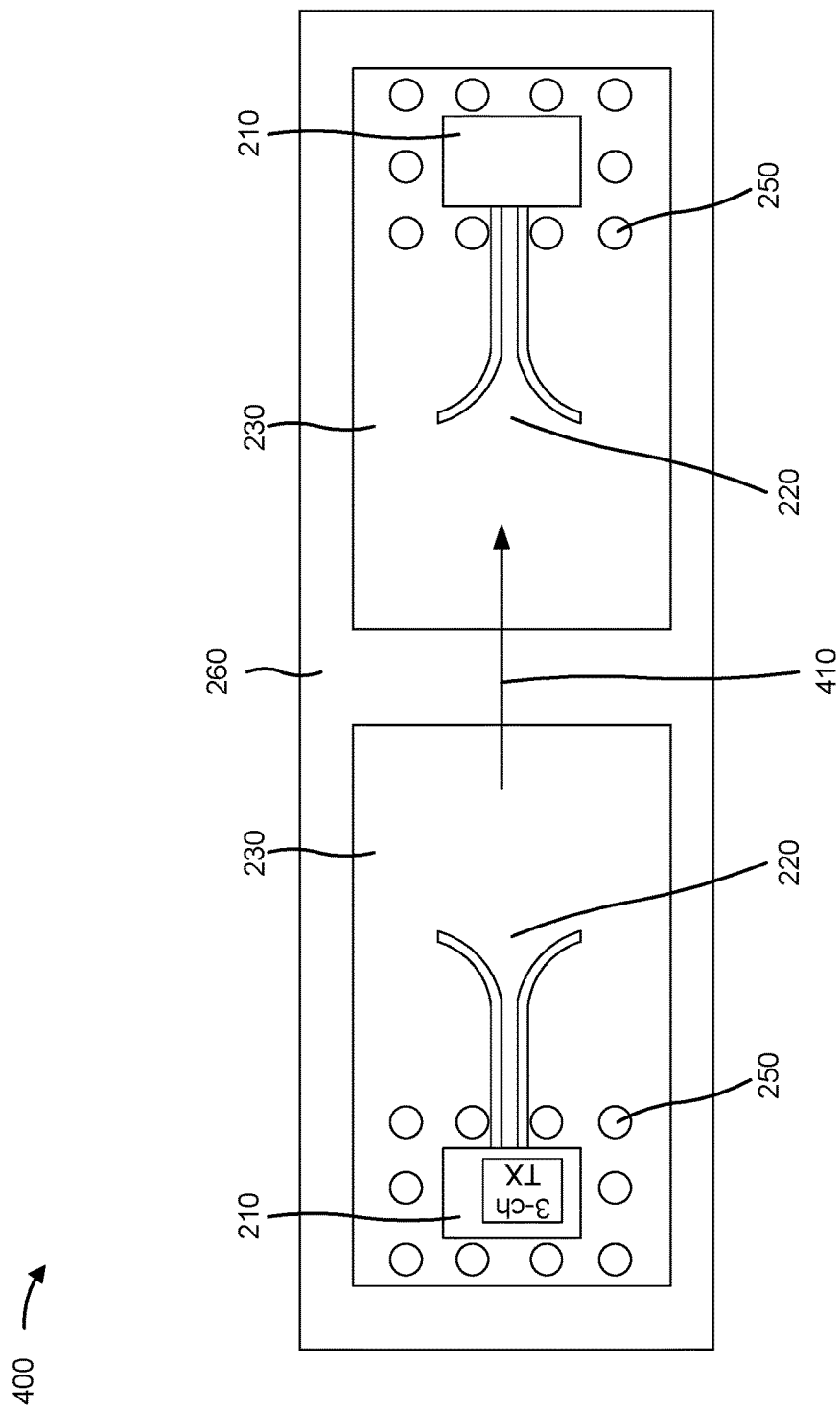
FIG. 4 shows a schematic top view of the semiconductor modules of a wireless communication system.

FIG. 4 shows a combination of two chips (two semiconductor modules of a wireless communication system 400), which communicate with each other through the integrated antennas 220, on a carrier board 260. The chips may also be arranged on different carrier boards. The semiconductor modules represent circuits with antennas 220 integrated into the package 230, which radiate or receive in parallel to the package 230. In this way, a wireless signal transmission 410 can be enabled. In other words, FIG. 4 shows a wireless signal transmission 410 by means of antennas 220 integrated into the package, which radiates or receives in parallel to the package surface, for example.

Some embodiments relate to a chip-to-chip communication by means of antennas integrated in packages. In this way, signals can be transmitted between electronic devices. For example, at radio systems, which comprise a transmitter device and a receiver device, the frequency signal, which is generated by the transmitter and radiated, may also be directed to the receiver so that it can be used as reference signal (local oscillator LO signal) for a comparison with the signal received by the receiver. The signal transmitted by the transmitter may be reflected at objects to be detected and may be again received by the receiver (e.g. for radar applications). In this process, the signal experiences a frequency shift). A comparison of this frequency with the local oscillator LO frequency may allow a conclusion to information on the observed object as position and/or relative speed to the transmitter. Distant radar systems in the automotive area may be implemented on this principle (e.g. see FIG. 5).

For a system which comprises more than one transmit and/or receive device, all components may be synchronized with a signal. For example, this may be important for future radar systems which comprise several simple devices for implementing a complex system. For example, a three channel transmitter may be used for a signal to radiate a radar signal at an antenna and the two other signals may be used as local oscillator LO signals for one of two receiver devices respectively. The more receiver channels are available in a system, the better important system characteristic numbers or coefficients as the angle resolution may be obtained. The system performance may be increased by implementing different receive antennas further away from each other, since the angle resolution may be proportional to the distance of the receive antennas. With the proposed system, the distance between the antennas may avoid limitation to the dimension of the carrier boards, on which the antennas and the receive devices are arranged, for example.

Further, a signal transmission between receivers, which are not arranged or mounted to a common carrier board, may be enabled. In this way, sensors may be combined to a complete system which may be able to detect a larger region of objects by sensors. In this way, a radar system may replace an ultrasonic sensor as distance warning or parking assistance in the automotive area. The sensors may be implemented in the bumper and may comprise a distance of several ten centimeters up to some meters, for example.

Figure 5:
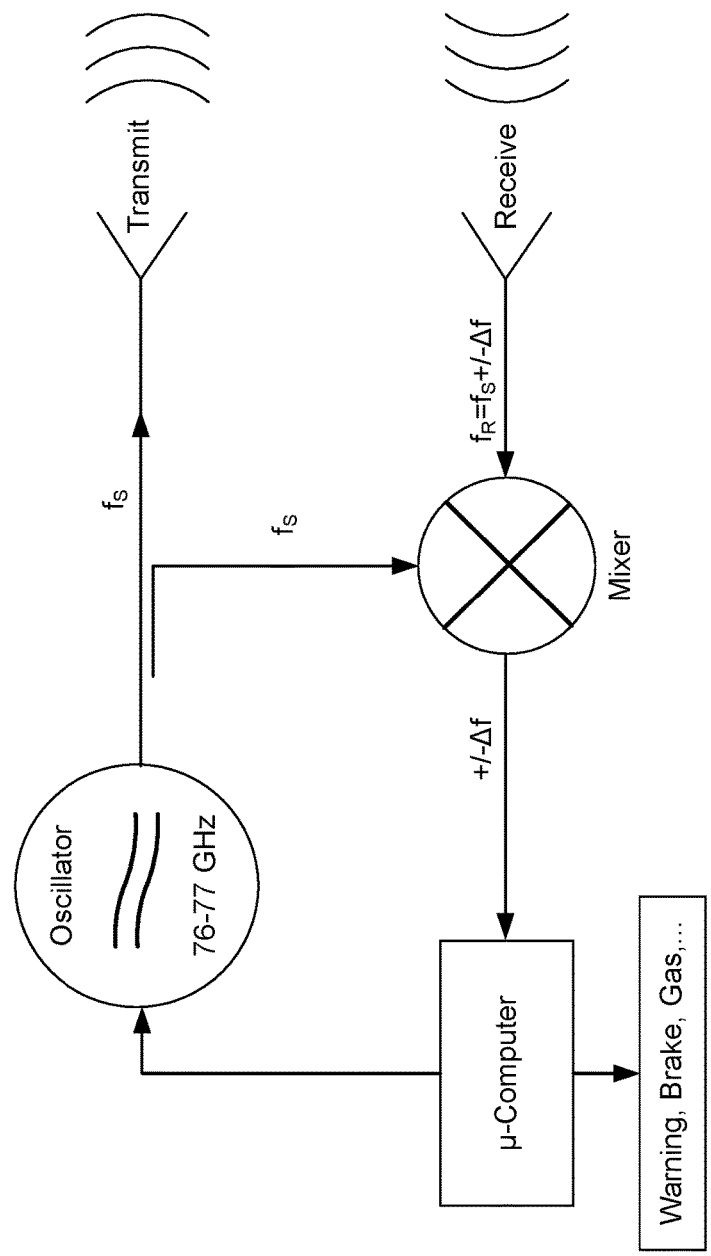
FIG. 5 shows a schematic illustration of a radar system.

Some embodiments relate to a radar system comprising a wireless communication system according to the described concept or one or more embodiments described above. A schematic illustration of the function of a distance radar 500 is shown in FIG. 5. A transmitter may generate a transmit signal with a frequency $f_s$ and radiates the signal through an antenna. The signal reflected at objects may experience a frequency shift and is received by the receiver. A part of the transmit signal may be transmitted from the transmitter to the receiver as local oscillator LO signal (wireless communication signal) and may be used as comparison frequency for the receive signal.

In other words, the first semiconductor device may comprise an oscillator on the semiconductor die (e.g. with a frequency of 76 to 77 GHz) and transmits a radar signal to objects in the proximity of the radar system. Further, the first semiconductor module transmits the local oscillator signal or a signal containing information on the phase of the local oscillator signal for a separate antenna structure or the same antenna structure as for transmitting the radar signal to a second semiconductor module with a receiver module comprising a mixer. The second semiconductor module receives the reflected radar signal and the wireless communication signal comprising information on the local oscillator signal through the same or different antenna structures. Further, the mixer mixes the wireless communication signal or a signal derived from the wireless communication signal rebuilding the local oscillator signal with the received reflected radar signal $f_R = f_S \pm \Delta f$ to obtain information on frequency differences $\pm \Delta f$. Further, the radar system may comprise a microcomputer (μ-computer) determining a position information based on the determined frequency offset and may trigger a warning or may operate a brake or the gas of a car, for example.

In more general words, the first semiconductor module may comprise a radar transmit module (same or separate to the transmitter module for transmitting the wireless communication signal), configured to transmit a radar signal to at least one object in the proximity of the radar system. Further, the second semiconductor module may comprise a radar receiver module (e.g. same or additional to the receiver module for receiving the wireless communication signal) configured to receive the reflected radar signal caused by a reflection of the radar signal at the at least one object.

Further, the wireless communication signal may contain information on a phase of a local oscillator signal used for generating the radar signal by the first semiconductor module. The radar system may determine a position of the at least one object based on the received reflected radar signal and the information on a phase of a local oscillator signal contained by the received wireless communication signal. The position information may be determined by a circuitry located on the semiconductor die of the first semiconductor module or a circuitry located on the semiconductor die of the second semiconductor module or may be implemented by a processing module (e.g. microcomputer) implemented by another module, for example.

Using a proposed signal, signal power losses caused by wired chip-to-chip connections may be avoided. For example, for high frequency applications (e.g. 60 GHz WLAN wireless local area network or 76 to 81 GHz radar applications in the automotive area), the signal power losses, which occur at the (wired) transmission path, may be so large that they may lead to a significant influence to the system properties. For example, transmission losses of about 2-3 dB in the frequency range larger than 60 GHz may occur at chip connections of carrier boards as a bond wire or a solder connection with a solder ball. The damping of a line on a PCB may be 1 dB per cm for expansive high frequency HF suitable substrates. Such high losses may be avoided due to the wireless communication. Further, larger distances between different devices may be enabled (which are limited for wired connections). Further, systems with several receivers may be possible, since problems due to crossing wires at the top layer of the PCB may be avoided. Due to the wireless communication, the geometric arrangement of the receivers may be selected arbitrarily. Further, the distance between the receivers may be selected arbitrarily.

Further, several receivers can be supplied with the same wireless communication signal simultaneously. Additionally, a high frequency signal transmission between devices on different carrier boards with distances of more than 10 cm (e.g. for distributed sensors in the automotive area) in the frequency range larger than 10 GHz may be enabled.

In other words, the restrictions of the wired transmission of high frequency signals may be avoided by implementing an antenna for radiating and/or receiving signals to be transmitted in a package and transmitting the signal through these antennas from one chip to another.

In this way, an electrically conductive connection between different components of the systems can be avoided, the components must not be mounted to the same carrier board and/or receivers may be arranged at arbitrary positions, since crossing wires are not the limiting aspect due to the wireless communication between the chips, for example. Further, an arbitrary number of receivers can be addressed simultaneously by one signal of the transmitter. In this way, it may be avoided that the transmit channels and in this way the system power loss scales with the number of receivers. Additionally, receivers on different carrier ports can be combined to a complete or overall system. Further, receivers can be arranged further away from each other as the size of a carrier board. Additionally, systems with operating frequencies larger than 10 GHz and with a distance of more than 10 cm of separate components may be synchronized. Further, expensive high frequency HF substrates may be avoided. An arbitrary three dimensional (3D) arrangement of components may be enabled. Additionally to the transmission of a signal for system synchronization, also other data may be transmitted. Some applications may be the wake-up of sensors from the idle mode or standby mode as soon as a sensor detects a target and gives a warning signal, focusing of sensors to a target, which is identified by a sensor of this system and/or an exchange of measurement data, for example.

The integration of antennas into a common package may be easier for increasing system frequencies, since the necessary antenna size may scale with the wavelength (e.g. about 2 mm for 77 GHz).

Antennas for radiating or receiving signals may be formed by a wafer level package process. Such antennas may radiate mainly orthogonal or in parallel to the chip or a PCB surface, for example.

Chips with orthogonal radiation characteristics may be used for communicating between chips arranged above each other and chips with parallel radiation characteristic may be used for chips which are arranged next to each other on a PCB, for example.

For example, a so-called Vivaldi antenna may comprise a radiation characteristic radiating mainly in parallel to the plane, in which the antenna is formed.

A proposed system may use an antenna, which radiates mainly in parallel to an orientation on the carrier board, together with an electric circuitry integrated in a package used for a direct communication between different devices. The different devices may be arranged on a common carrier board or may be located on different carrier boards. The antenna may be formed out of the redistribution layer of a wafer level package. The wafer level package may be a fan out package (e.g. the lateral dimension of the package is larger than the integrated semiconductor chip) and the antenna may be formed on the plastic part of the fan out package, for example.

The communication may avoid a restriction to two devices. For the communication between more than two devices, more than one antenna may be integrated to a package so that the transmit and/or receive antennas between two chips can be geometrically aligned to each other, for example. For example, one transmitter with two antennas which radiate (mainly) to the left and to the right (two opposite directions) may be located in the middle of a system and to the left and to the right (in opposite directions) from the transmitter, a receiver may be arranged respectively.

The chip-to-chip communication may avoid limitation to devices arranged on a common circuit board. Different circuit boards may also be arranged out of a common plane (e.g. must not be distributed next to each other in a plane). If two circuit boards are arranged above each, the chips can be wirelessly communicating with each other, by integrating antennas, which mainly radiate orthogonally to the package surface, for example.

According to an aspect, a radio system with at least two components can be implemented which transmits signals from one to the other component by means of antennas integrated into the packages of the components.

Optionally, a proposed system may be implemented with integrated antennas formed out of the redistribution layer of a wafer level package.

Further, a proposed system may comprise a transmit frequency larger than 10 GHz. Alternatively, frequencies of 24 GHz (e.g. car radar), 60 GHz (e.g. wireless local area network WLAN), 76 to 81 GHz (car radar) and higher frequencies may be used, for example. For example, a proposed system may be an automotive radar system using a frequency of 76 GHz or more, for example. The antenna sizes may scale with the wavelength of the transmit frequency so that the antennas may be large for low frequencies. At 77 GHz, the antenna dimension may be some millimeters, for example.

Another proposed system may comprise several components receiving a common signal without a wired connection between the components.

Optionally, a proposed system may comprise components not mounted to a common carrier board.

Further optionally, a proposed system may comprise components arranged more than 10 cm away from each other and signals may be transmitted at more than 10 GHz.

Some systems may comprise components which are arranged to each other so that (virtual) connecting lines cross each other (e.g. which may be impossible with wired connections).

A proposed system may comprise a signal radiation mainly in parallel to a package surface and may comprise different system components arranged next to each other.

Alternatively, a system may comprise a signal radiation mainly orthogonal to a package surface and may comprise different system components arranged above each other, for example.

Figure 6:
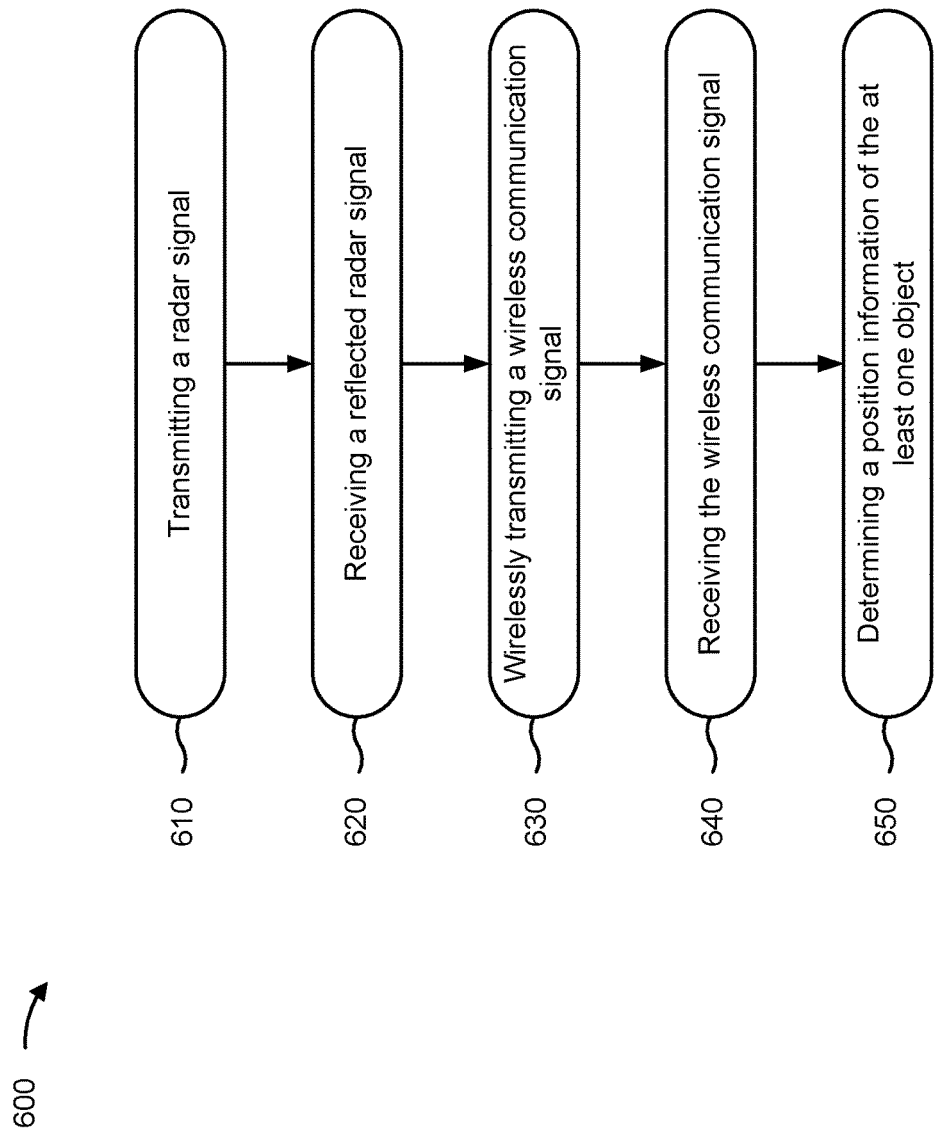
FIG. 6 shows a flowchart of a method for determining a position information of an object.

FIG. 6 shows a flowchart of a method 600 for determining a position information of an object according to an embodiment. The method 600 comprises transmitting 610 a radar signal to at least one object by a transmitter device and receiving 620 a reflected radar signal caused by a reflection of the radar signal at the least one object by a receiver device. Further, the method 600 comprises wirelessly transmitting 630 a wireless communication signal containing information on a phase of a local oscillator signal used for generating the radar signal by the transmitter device and receiving 640 the wireless communication signal by the receiver device. Further, the method 600 comprises determining 650 a position information of the at least one object based on the received reflected radar signal and the information on the phase of the local oscillator signal contained by the received wireless communication signal.

Due to the wireless transmission of the information on the phase of the local oscillator signal, the transmitter device and the receiver device can be arranged at arbitrary positions, for example.

The method 600 may be implemented by a proposed radar system described above, for example.

The transmitter device and the receiver device may be implemented by semiconductor modules described above.

Further, the method 600 may comprise one or more optional additional features or acts corresponding to one or more aspects mentioned in connection with the described concept or one or more embodiments described above.

Embodiments may further provide a computer program having a program code for performing one of the above methods, when the computer program is executed on a computer or processor. A person of skill in the art would readily recognize that acts of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:
1. A radar system, comprising:
   a first semiconductor die, comprising:
      an oscillator configured to generate a first local oscillator signal; and
      a transmitter configured to wirelessly transmit a radar signal based on the first local oscillator signal and wirelessly transmit a wireless signal comprising information corresponding to the first local oscillator signal; and
   a second semiconductor die, comprising:
      a receiver configured to receive the wireless signal and a reflected radar signal corresponding to a reflection of the radar signal,
         wherein the receiver is configured to generate a second local oscillator signal from the information corresponding to the first local oscillator signal of the wireless signal, and
         wherein the receiver comprises a mixer configured to receive the reflected radar signal and the second local oscillator signal to obtain information on a frequency difference between the reflected radar signal and the second local oscillator signal based on a mixing of the second local oscillator signal and the reflected radar signal, wherein the first semiconductor die and the second semiconductor die are separated by a distance of at least 5 cm.

2. The radar system of claim 1, further comprising:
a processing module configured to determine position information based on the frequency difference.

3. The radar system of claim 1, wherein the information corresponding to the first local oscillator signal is phase information of the first local oscillator signal, and
the receiver is configured to rebuild the first local oscillator signal as the second local oscillator signal based on the phase information of the first local oscillator signal.

4. The radar system of claim 1, further comprising:
an antenna coupled to the first semiconductor die,
wherein the wireless signal is transmitted via the antenna
wherein the antenna comprises a first antenna configured to transmit the wireless signal and a second antenna configured to transmit the radar signal.

5. The radar system of claim 1, further comprising:
an antenna coupled to the first semiconductor die,
wherein the wireless signal is transmitted via the antenna, and
wherein the antenna is configured to simultaneously transmit the wireless signal and the radar signal.

6. The radar system of claim 1, further comprising:
an antenna coupled to the first semiconductor die,
wherein the wireless signal is transmitted via the antenna, and
wherein the first semiconductor die and the antenna are arranged within a common package.

7. The radar system of claim 6, wherein the common package is a wafer level package.

8. The radar system of claim 1, wherein the transmitter is a multi-channel transmitter configured to transmit the wireless signal from a first channel and transmit the radar signal from a second channel.

9. A method, comprising:
generating, by an oscillator of a first semiconductor die, a first local oscillator signal;
transmitting wirelessly, by the first semiconductor die, a wireless signal comprising information corresponding to the first local oscillator signal;
transmitting wirelessly, by the first semiconductor die, a radar signal based on the first local oscillator signal, wherein the radar signal and the wireless signal are transmitted simultaneously;
receiving, by a second semiconductor die, the wireless signal and a reflected radar signal corresponding to a reflection of the radar signal;
generating, by the second semiconductor die, a second local oscillator signal from the information corresponding to the first local oscillator signal of the wireless signal; and
mixing, by a mixer of the second semiconductor die, the reflected radar signal and the second local oscillator signal to obtain information on a frequency difference between the reflected radar signal and the second local oscillator signal,
wherein the first semiconductor die and the second semiconductor die are arranged with a distance of more than 5 cm therebetween.

10. The method of claim 9, further comprising:
determining position information based on the frequency difference.

11. The method of claim 9, wherein the information corresponding to the first local oscillator signal is phase information of the first local oscillator signal,
wherein the method further comprises rebuilding, by the second semiconductor die, the first local oscillator signal as the second local oscillator signal based on the phase information of the first local oscillator signal.

12. The method of claim 9, wherein an antenna is coupled to the first semiconductor die, and
wherein the wireless signal is transmitted via the antenna.

13. The method of claim 12, wherein the antenna comprises a first antenna configured to transmit the wireless signal and a second antenna configured to transmit the radar signal.

14. The method of claim 12, wherein the antenna is configured to transmit the wireless signal and the radar signal.

15. The method of claim 12, wherein the first semiconductor die and the antenna are arranged within a common package.

16. The method of claim 15, wherein the common package is a wafer level package.

17. The method of claim 9, wherein the first semiconductor die includes a multi-channel transmitter configured to transmit the wireless signal from a first channel and the radar signal from a second channel.

18. The radar system of claim 1, wherein the transmitter is configured to simultaneously transmit the radar signal and the wireless signal.

19. The radar system of claim 1, wherein the wireless signal includes the first local oscillator signal as the information corresponding to the first local oscillator signal.

20. The radar system of claim 1, further comprising:
a third semiconductor die, comprising:
a further receiver configured to receive the wireless signal and a further reflected radar signal corresponding to a further reflection of the radar signal,
wherein the further receiver is configured to generate a third local oscillator signal from the information corresponding to the first local oscillator signal of the wireless signal, and
wherein the further receiver comprises a further mixer configured to receive the further reflected radar signal and the third local oscillator signal to obtain information on a further frequency difference between the further reflected radar signal and the third local oscillator signal based on a mixing of the third local oscillator signal and the further reflected radar signal.

21. The radar system of claim 1, wherein the transmitter is configured to wirelessly transmit a further wireless signal comprising the information corresponding to the first local oscillator signal,
wherein the radar system of claim 1 further comprises:
a third semiconductor die, comprising:
a further receiver configured to receive the further wireless signal and a further reflected radar signal corresponding to a further reflection of the radar signal,
wherein the further receiver is configured to generate a third local oscillator signal from the information corresponding to the first local oscillator signal of the further wireless signal, and
wherein the further receiver comprises a further mixer configured to receive the further reflected radar signal and the third local oscillator signal to obtain information on a frequency difference between the further reflected radar signal and the third local oscillator signal based on a mixing of the third local oscillator signal and the further reflected radar signal.

22. The radar system of claim 21, wherein the transmitter is configured to simultaneously transmit the radar signal, the wireless signal, and the further wireless signal.

23. The radar system of claim 1, further comprising:
an antenna structure coupled to the first semiconductor die,
wherein the antenna structure is configured to transmit the wireless signal in a first direction parallel to a main surface of the first semiconductor die with a first signal strength and in a second direction orthogonal to the main surface of the first semiconductor die with a second signal strength,
wherein the first signal strength is greater than or less than the second signal strength based on an arrangement of the first semiconductor die relative to the second semiconductor die.

24. The radar system of claim 23, wherein the antenna structure includes a Vivaldi antenna configured to transmit the wireless signal.

25. The radar system of claim 1, further comprising:
an antenna structure coupled to the first semiconductor die,
wherein a first main surface of first semiconductor die is arranged parallel to a second main surface of the second semiconductor die, and
wherein the first semiconductor die and the second semiconductor die are arranged laterally from each other, and wherein the antenna structure is configured to transmit the wireless signal in a direction parallel to the first main surface and the second main surface with a signal strength that is larger than a signal strength of the wireless signal in a direction orthogonal to the first main surface and the second main surface, or
wherein the first semiconductor die and the second semiconductor die are arranged are arranged vertically from each other, and wherein the antenna structure is configured to transmit the wireless signal in the direction orthogonal to the first main surface and the second main surface with a signal strength that is larger than a signal strength of the wireless signal in the direction parallel to the first main surface and the second main surface.

* * * * *